United States Patent [19]

Michel et al.

[11] Patent Number: 4,591,408
[45] Date of Patent: May 27, 1986

[54] LIQUID PHASE GROWTH OF CRYSTALLINE POLYPHOSPHIDE

[75] Inventors: Christian G. Michel, Ossining; Henry S. Marek, Mount Vernon; John A. Baumann, Ossining, all of N.Y.

[73] Assignee: Stauffer Chemical Company, Westport, Conn.

[21] Appl. No.: 509,158

[22] Filed: Jun. 29, 1983

Related U.S. Application Data

[63] Continuation-in-part of Ser. No. 442,208, Nov. 16, 1982, Pat. No. 4,508,931, and a continuation-in-part of Ser. No. 419,537, Sep. 17, 1982, and a continuation-in-part of Ser. No. 335,706, Dec. 30, 1981, abandoned.

[51] Int. Cl.$^4$ ............................................. C30B 19/00
[52] U.S. Cl. ..................................... 156/605; 156/624
[58] Field of Search ................... 156/624, 623 R, 622, 156/DIG. 112, DIG. 70, 605; 423/299, 316, 322, 323

[56] References Cited

U.S. PATENT DOCUMENTS 3,810,794  5/1974  Antypas et al. ............ 156/DIG. 70

OTHER PUBLICATIONS

The Synthesis and Crystal Structure of the Polyphosphides La$_6$Ni$_6$P$_{17}$, Ce$_6$Ni$_6$P$_{17}$, and Pr$_6$Ni$_6$P$_{17}$, Braun et al., Acta. Cryst., 1978, B 34, 2069–2074.
The Crystal Structure of ZnSnP$_{14}$ and Its Relationship to Hittorf Phosphorous and Other Polyphosphides, Pachali et al., Acta. Cryst., A31, Suppl. 3, 69 (1976).
KP$_{15}$, A New Polyphosphide, von Schnering et al., Angew. Chem. Internat. Edit./vol. 6 (1967)/No. 4.

Primary Examiner—Hiram H. Bernstein
Attorney, Agent, or Firm—F. Eugene Davis, IV

[57] ABSTRACT

Polycrystalline and monocrystalline potassium polyphosphide, KP$_{15}$, has been grown from the liquid phase at a temperature range of 600°–700° C. Massive crystallization of KP$_{15}$ whiskers and platelets is observed. Crystalline KP$_{15}$ films have been grown on gallium arsenide (110) and gallium phosphide (111) polished wafers, silicon (110) polished wafers, quartz, on a nickel evaporated 2000 angstrom nickel layer on quartz, and on nickel foil. Microcrystalline KP$_{15}$ formed by a condensed phase process is incorporated into a sealed ampule evacuate 10$^{-4}$ torr. The temperature is raised to 655° C. and the furnace tilted to bring the melt in contact with the substrates. The temperature is then reduced to 640° C. and the furnace is tilted back to the original position. Large KP$_{15}$ whiskers several millimeters in size are grown from the melt and crystalline films of KP$_{15}$ are grown topotaxially on gallium arsenide and gallium phosphide. Crystalline platelets of KP$_{15}$ 3×3 mm have been obtained by cleaving the grown film from a gallium phosphide substrate.

12 Claims, 3 Drawing Figures

FIG. 1
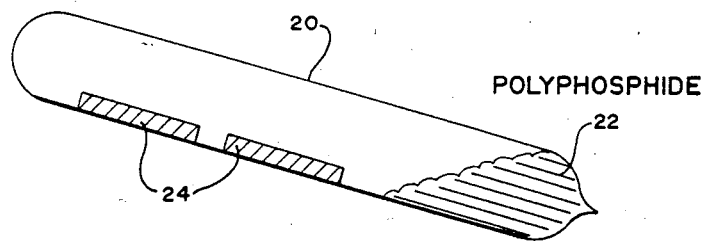
FIG. 2
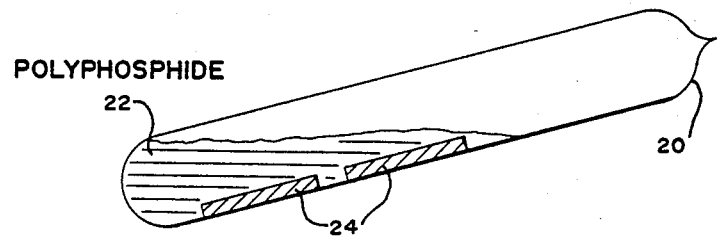
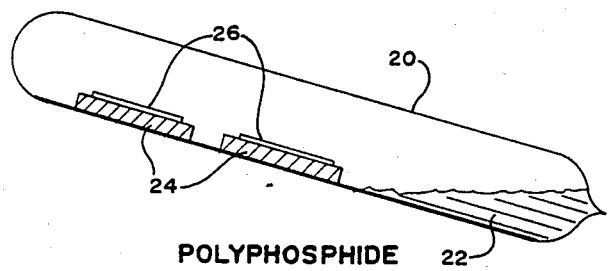
FIG. 3

LIQUID PHASE GROWTH OF CRYSTALLINE POLYPHOSPHIDE

RELATED APPLICATIONS

This application is a continuation-in-part of U.S. patent applications of the below-identified co-pending U.S. patent applications Ser. Nos. 335,706 filed 12/30/81, now abandoned; 419,537, filed 9/17/82; 442,208 filed 11/16/82, now U.S. Pat. No. 4,508,931.

This application is related to the following co-pending applications, assigned to the same assignee as this application. These applications are incorporated herein by reference. U.S. patent application entitled CATENATED SEMICONDUCTOR MATERIALS OF PHOSPHORUS, METHODS AND APPARATUS FOR PREPARING AND DEVICES USING THEM, Ser. No. 335,706, filed Dec. 30, 1981, now abandoned; MONOCLINIC PHOSPHORUS FORMED FROM VAPOR IN THE PRESENCE OF AN ALKALI METAL, Ser. No. 419,537, filed Sept. 17, 1982, which is a continuation-in-part of Ser. No. 335,706; CATENATED PHOSPHORUS MATERIALS, THEIR PREPARATION AND USE, AND SEMICONDUCTOR AND OTHER DEVICES EMPLOYING THEM, Ser. No. 442,208, filed Nov. 16, 1982, which is a continuation-in-part of Ser. Nos. 335,706 and 419,537 and the applications of Rozalie Schachter; Marcello Viscogliosi, and Lewis A. Bunz, entitled SPUTTERED SEMICONDUCTING FILMS OF CATENATED PHOSPHORUS MATERIALS AND DEVICES FORMED THEREFROM Ser. No. 509,175, filed June 29, 1983; David G. Brock and John A. Baumann, entitled VACUUM EVAPORATED FILMS OF CATENATED PHOSPHORUS MATERIAL Ser. No. 509,159, filed June 29, 1983; Diego Olego, David G. Brock, John A. Baumann, and William E. Spicer, entitled MIS DEVICES EMPLOYING ELEMENTAL PNICTIDE OR POLYPHOSPHIDE INSULATING LAYERS Ser. No. 509,210, filed June 29, 1983; and, Gary K. Miller, John A. Baumann, David G. Brock, and Mark A. Kuck, entitled GRAPHITE INTERCALATED ALKALI METAL VAPOR SOURCES Ser. No. 509,157, filed June 29, 1983.

TECHNICAL FIELD

This invention relates to the liquid phase growth of crystalline polyphosphide. More particularly it relates to the growth of large crystals of $KP_{15}$ for use in other processes of the above-identified applications, to the application of phosphorus layers to silicon and silicon integrated circuit devices and to the application of phosphorus layers as the insulating layer in MIS devices on III-V semiconductors.

The large crystals of polyphosphides formed by the process of the invention may also be used in electro-optical devices and as optical rotators.

BACKGROUND ART

The above-identified, previously filed, co-pending applications disclose semiconductors formed of catenated phosphorus materials. It is highly desirable that large crystals of these materials be formed for use in electronic and electro-optical devices and as optical rotators. It is also highly desirable that such materials be grown on III-V semiconductors such as gallium arsenide and gallium phosphide to form the I-layer thereof in MIS devices as disclosed in the above-identified co-pending application of Diego Olego, David G. Brock, John A. Baumann, and William E. Spicer entitled MIS DEVICES EMPLOYING ELEMENTAL PNICTIDE OR POLYPHOSPHIDE INSULATING LAYERS filed herewith, which application is incorporated herein by reference.

DISCLOSURE OF THE INVENTION

Quartz tubes of 10 mm outside diameter and 6 mm inside diameter or 11 mm outside diameter and 9 mm inside diameter are loaded with 0.5-2.0 grams of $KP_{15}$ material produced by the condensed phase process of the above-identified, previously filed co-pending applications. The ampules are pumped down to $10^{-4}$ torr and sealed off under vacuum.

Referring to FIG. 1, a sealed quartz ampule 20 contains a charge of condensed phase $KP_{15}$ 22 and substrates 24. The ampule 20 is mounted in a furnace, tilted as shown and heated to 655° C. in order to melt the $KP_{15}$ charge 22. The ampule is then titled as shown in FIG. 2 so that the melt 22 is in contact with the substrates 24. This may be accomplished by tilting the entire furnace including the ampule. The ampule 20 is then allowed to slowly cool at a rate of between 6° to 60° per hour to 640° C. and then the ampule 20 is tilted to its original position as shown in FIG. 3 and rapidly cooled to room temperature. Polycrystalline films 26 form on the substrates 24 during the slow cooling.

Polished wafers of gallium arsenide cleaved along the 110 face and gallium phosphide cleaved along the 111 face, silicon cleaved along the 110 face, a 2000 angstroms evaporated nickel layer on quartz, quartz, and nickel foil have been utilized as substrates. In all cases massive crystallization of $KP_{15}$ whiskers and platelets directly from the melt has been observed. Polycrystalline $KP_{15}$ films were grown on all of the substrates. Crystalline $KP_{15}$ platelets 3×3 mm in size have been obtained by cleaving grown film from gallium phosphide substrates. Two-dimensional growth of $KP_{15}$ film on the P face of gallium phosphide is observed. The surface morphology of the grown layer suggests topotaxial growth and provides the basis for the application of $KP_{15}$ thin films as the insulating layer for gallium arsenide, gallium phosphide and indium phosphide MIS devices.

By incorporating nickel foil or nickel powder 1-5% by weight in the polyphosphide melt and raising the melt to a temperature of 670° C. and then slowly cooling, while the melt is in contact with the substrates, to 630° C. in situ doping of $KP_{15}$ with nickel has been produced.

We believe that other alkali metal polyphosphides, of the formula $MP_{15}$, where M is an alkali metal, may also be grown from the liquid melt.

OBJECTS OF THE INVENTION

It is therefore an object of the invention to provide polyphosphide materials.

Another object of the invention is to provide polyphosphide materials by liquid phase growth.

A further object of the invention is to provide polyphosphide films by liquid phase growth on a variety of substrates.

A still further object of the invention is to provide large crystals of polyphosphides.

Yet another object of the invention is to provide semiconductor and electro-optical devices, optical film coatings and optical rotators.

Other objects of the invention will in part be obvious and will in part appear elsewhere in this application.

The invention accordingly comprises several steps and the relations of one or more of such steps with respect to each of the others and the articles possessing the features, properties and relation of elements which are exemplified in this application. The scope of the invention is indicated in the claims.

BRIEF DESCRIPTION OF THE DRAWING

For a fuller understanding of the nature and objects of the invention reference should be made to the following detailed description taken in connection with the accompanying drawing in which FIGS. 1, 2 and 3 are schematic diagrams illustrating how a heated ampule is utilized in carrying out the method of the invention.

BEST MODE FOR CARRYING OUT THE INVENTION

We have found that the ampules should first be heated to between 650° and 670° C. in order to melt the charge. When nickel dopant is included in the charge, temperatures in the higher portion of the range are preferred. The slow cooling when the melt is in contact with the substrates may as previously stated vary between 6° C. and 60° C. per hour. The final cooling temperature while the melt is still in contact with the substrates can vary between 640° to 645° C.

In all cases large quantities of polycrystalline whiskers and platelets are formed directly from the melt as well as on the substrates. Thus the process is a convenient technique to produce large quantities of high quality $KP_{15}$ polycrystalline bulk material in a relatively short time (a few hours) for use in other processes.

"III-V semiconductors" as used herein means those semiconductors commonly called intermetallic or compound, formed of compounds of elements from column III and column V of the periodic table, such as aluminum phosphide, aluminum arsenide, aluminum antimonide, gallium phosphide, gallium arsenide, gallium antimonide, indium phosphide, indium arsenide and indium antimonide.

It will thus be seen that the objects set forth above, among those made apparent from the preceding description, are efficiently obtained and, since certain changes may be made in carrying out the above methods and in the articles set forth without departing from the scope of the invention, it is intended that all matter contained in the above description or shown in the accompanying drawing, shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Particularly, it is to be understood that in the claims ingredients or compounds recited in the singular are intended to include compatible mixtures of such ingredients wherever sense permits.

Having described our invention what we claim as new and desire to secure by Letters Patent is:

1. A method of growing polyphosphide crystals comprising the steps of:
   (A) heating a polyphosphide charge in a sealed vessel to a solventless melt having a temperature substantially within the range of 650° to 670° C.;
   (B) slowly cooling said melt to form polyphosphide crystals from said melt; and
   (C) bringing said melt into contact with a substrate to form said crystals on said substrate during said slow cooling step.

2. The method of growing polyphosphide crystals defined in claim 1 and the further step of:
   (D) removing said melt from said substrate at the termination of said slow cooling step.

3. The method defined in claim 2, and the further step of:
   (E) terminating said slow cooling step when the melt reaches a temperature substantially in the range of 630° to 640° C.

4. The method defined in claim 1 wherein said vessel is evacuated prior to said heating step.

5. The method defined in claim 1 wherein said slow cooling step is carried out at a rate substantially within the range of 6° C. to 60° C. per hour.

6. The method defined in claims 1, 2 or 3, wherein said substrate is a III-V semiconductor.

7. The method defined in claim 6, wherein said substrate is gallium phosphide.

8. The method defined in claim 6, wherein the substrate is gallium arsenide.

9. The method defined in claim 1, 2 or 3, wherein said melt comprises a metal dopant.

10. The method defined in claim 9, wherein said dopant is nickel.

11. The method defined in claim 1 wherein said polyphosphide is $MP_{15}$, and M is an alkali metal.

12. A method of growing polyphosphide crystals comprising:
   (A) heating a polyphosphide charge of $KP_{15}$ in a sealed vessel in a solventless melt having a temperature substantially within the range of 650° C. to 670° C.; and
   (B) slowly cooling said melt to form polyphosphide crystals of $KP_{15}$ from said melt.

* * * * *